US012805384B2

(12) United States Patent
Tsuchida et al.

(10) Patent No.: US 12,805,384 B2
(45) Date of Patent: Nov. 17, 2026

(54) ELECTRONIC APPARATUS, SEMICONDUCTOR DEVICE, INSULATING SHEET, AND SEMICONDUCTOR DEVICE MANUFACTURING METHOD

(71) Applicant: Sony Interactive Entertainment Inc., Tokyo (JP)

(72) Inventors: Shinya Tsuchida, Tokyo (JP); Nils Sabelstrom, Uppsala (SE); Mitsuharu Morishita, Tokyo (JP); Kenji Hirose, Tokyo (JP); Masanori Hayashibara, Tokyo (JP); Tetsuji Tamura, Tokyo (JP); Sei Oonishi, Saitama (JP); Nobuyuki Sugawara, Chiba (JP)

(73) Assignee: Sony Interactive Entertainment Inc., Tokyo (JP)

( * ) Notice: Subject to any disclaimer, the term of this patent is extended or adjusted under 35 U.S.C. 154(b) by 1072 days.

(21) Appl. No.: 17/427,759

(22) PCT Filed: Feb. 3, 2020

(86) PCT No.: PCT/JP2020/003993
§ 371 (c)(1),
(2) Date: Jan. 24, 2022

(87) PCT Pub. No.: WO2020/162417
PCT Pub. Date: Aug. 13, 2020

(65) Prior Publication Data

US 2022/0262759 A1 Aug. 18, 2022

(30) Foreign Application Priority Data

Feb. 4, 2019 (JP) ................................ 2019-018217

(51) Int. Cl.
*H10W 76/60* (2026.01)
*H10W 40/25* (2026.01)
(Continued)

(52) U.S. Cl.
CPC .......... *H10W 76/60* (2026.01); *H10W 90/00* (2026.01); *H10W 40/257* (2026.01);
(Continued)

(58) Field of Classification Search
CPC ....... H01L 24/26; H01L 23/367; H01L 23/42; H01L 23/36; H01L 23/373; H01L 23/50;
(Continued)

(56) References Cited

U.S. PATENT DOCUMENTS 6,313,521 B1 * 11/2001 Baba .................. H10W 40/778 257/659
6,433,412 B2 8/2002 Ando
(Continued)

FOREIGN PATENT DOCUMENTS

CN 101379612 A 3/2009
EP 1988574 A1 11/2008
(Continued)

OTHER PUBLICATIONS

Extended European Search Report for corresponding EP Application No. 20752103.0, 12 pages, dated Oct. 28, 2022.
(Continued)

*Primary Examiner* — Marc-Anthony Armand
(74) *Attorney, Agent, or Firm* — Kilpatrick Townsend & Stockton LLP

(57) ABSTRACT

In a structure using a metal having fluidity as a thermally conductive material, the thermally conductive material is prevented from entering an unintended region even in a case where a change in attitude of a semiconductor device or vibration occurs. An electronic apparatus has a thermally conductive material formed between a radiator and a semiconductor chip. The thermally conductive material has fluidity at least at a time of operation of the semiconductor chip. In addition, the thermally conductive material has
(Continued)

electric conductivity. The thermally conductive material is surrounded by a seal member. A capacitor is covered by an insulating portion.

17 Claims, 14 Drawing Sheets

(51) Int. Cl.

| | |
|---|---|
| ***H10W 72/00*** | (2026.01) |
| ***H10W 72/30*** | (2026.01) |
| ***H10W 74/15*** | (2026.01) |
| ***H10W 90/00*** | (2026.01) |

(52) U.S. Cl.

CPC .... *H10W 40/258* (2026.01); *H10W 72/07351* (2026.01); *H10W 72/07354* (2026.01); *H10W 72/325* (2026.01); *H10W 72/347* (2026.01); *H10W 72/352* (2026.01); *H10W 72/354* (2026.01); *H10W 72/365* (2026.01); *H10W 72/367* (2026.01); *H10W 72/387* (2026.01); *H10W 72/877* (2026.01); *H10W 74/15* (2026.01); *H10W 90/724* (2026.01); *H10W 90/734* (2026.01); *H10W 90/736* (2026.01)

(58) Field of Classification Search

CPC ..... H01L 23/49816; H01L 2224/16225; H01L 2224/16227; H01L 2224/32225; H01L 2224/32245; H01L 2224/48227; H10W 72/072; H10W 72/073; H10W 72/00; H10W 72/252; H10W 72/951; H10W 42/121; H10W 40/70; H10W 40/10; H10W 40/25; H10W 40/22; H10W 90/701; H10W 90/754; H10W 76/40; H10W 95/00

See application file for complete search history.

(56) References Cited

U.S. PATENT DOCUMENTS

| | | | |
|---|---|---|---|
| 6,891,259 | B2 | 5/2005 | Im |
| 7,224,044 | B2 | 5/2007 | Kawada |
| 7,834,443 | B2 | 11/2010 | So |
| 2001/0050428 | A1 | 12/2001 | Ando |
| 2003/0085475 | A1 | 5/2003 | Im |
| 2003/0141576 | A1 | 7/2003 | Kawada |
| 2007/0290310 | A1 | 12/2007 | Kusano |
| 2008/0296755 | A1 | 12/2008 | So |
| 2011/0012255 | A1 | 1/2011 | Suganuma |
| 2014/0084441 | A1 * | 3/2014 | Chiu .................... H10W 40/10 257/692 |

FOREIGN PATENT DOCUMENTS

| | | | |
|---|---|---|---|
| JP | 09008179 | A | 1/1997 |
| JP | 11251347 | A | 9/1999 |
| JP | 2001267473 | A | 9/2001 |
| JP | 2002141445 | A | 5/2002 |
| JP | 2003152149 | A | 5/2003 |
| JP | 2003229517 | A | 8/2003 |
| JP | 2003249510 | A | 9/2003 |
| JP | 3116877 | U | 12/2005 |
| JP | 2007243106 | A | 9/2007 |
| JP | 2007335742 | A | 12/2007 |
| JP | 2012069902 | A | 4/2012 |
| JP | 2013004648 | A | 1/2013 |
| JP | 2014017371 | A | 1/2014 |

OTHER PUBLICATIONS

The First Office Action for corresponding CN Application No. 202080020762.1, 20 pages, dated Jan. 12, 2024.

International Search Report for corresponding PCT APplication No. PCT/JP2020/003993, 4 pages, dated Apr. 7, 2020.

Notice of Reasons for Refusal for corresponding PCT Application No. 2020-571194, 6 pages, dated May 10, 2022.

Notice of Reasons for Refusal for corresponding JP Application No. 2023-111664, 6 pages, dated Jul. 22, 2024.

International Preliminary Report on Patentability and Written Opinion for corresponding PCT Application No. PCT/JP2020/003993, 14 pages, dated Aug. 19, 2021.

Application No. EP20752103.0 , Office Action, Mailed on May 28, 2025, 5 pages.

Application No. EP20752103.0 , Office Action, Mailed on Oct. 14, 2025, 7 pages.

Application No. JP2023-111664 , Office Action, Mailed on Mar. 31, 2026, 4 pages.

Application No. JP2023-111664 , Office Action, Mailed on Jan. 7, 2025, 6 pages.

* cited by examiner

ELECTRONIC APPARATUS, SEMICONDUCTOR DEVICE, INSULATING SHEET, AND SEMICONDUCTOR DEVICE MANUFACTURING METHOD

TECHNICAL FIELD

The present disclosure relates to a technology for improving performance of cooling a semiconductor device.

BACKGROUND ART

A semiconductor chip constituting a semiconductor device that functions as a Central Processing Unit (CPU), a Graphics Processing Unit (GPU), or the like is thermally connected to and cooled by a radiator such as a heat sink or a heat pipe. There are many electronic apparatuses using grease as a thermally conductive material provided between the semiconductor chip and the radiator.

CITATION LIST

Patent Literature

[PTL 1] Japanese Patent Laid-Open No. 2012-69902
[PTL 2] Japanese Patent Laid-Open No. 2007-335742

SUMMARY

Technical Problem

However, when an amount of heat generated by the semiconductor chip is increased, it becomes difficult to cool the semiconductor chip sufficiently due to a thermal resistance possessed by the grease. In a semiconductor device of PTL 2, a metal that is liquefied by heat at the time of operation of the semiconductor chip is used as a thermally conductive material between the semiconductor chip and the radiator in place of the grease. The use of such a metal decreases a thermal resistance between the semiconductor chip and the radiator, and can therefore improve the performance of cooling the semiconductor chip.

In a structure using a metal having fluidity as the thermally conductive material, it is important to limit a range over which the thermally conductive material spreads even in a case where a change in attitude of the semiconductor device or vibration occurs in order to fully exert the cooling performance. In addition, when the radiator is pressed to the semiconductor chip, it is important for a pressing force to act fully on the semiconductor chip. That is, adhesion between the semiconductor chip and the radiator is also important.

Solution to Problem

An example of an electronic apparatus proposed in the present disclosure includes a semiconductor chip, a substrate that is disposed on a lower side of the semiconductor chip and has a first region as a region in which the semiconductor chip is mounted and a second region as a region in which a conductor element including at least one of a circuit pattern and an electric part is disposed, a radiator disposed on an upper side of the semiconductor chip, and a thermally conductive material present between the radiator and the semiconductor chip. The electronic apparatus further includes a seal member surrounding the thermally conductive material and an insulating portion covering the conductor element. The thermally conductive material has electric conductivity and has fluidity at least at a time of operation of the semiconductor chip. According to this electronic apparatus, the seal member and the insulating portion can limit a range over which the thermally conductive material spreads. Incidentally, in this electronic apparatus, the insulating portion is, for example, a part obtained by curing an insulating material, a sheet formed by an insulating material, or the like.

Another example of the electronic apparatus proposed in the present disclosure includes a semiconductor chip, a substrate that is disposed on a lower side of the semiconductor chip and has a first region as a region in which the semiconductor chip is mounted and a second region as a region in which a conductor element including at least one of a circuit pattern and an electric part is disposed, a radiator disposed on an upper side of the semiconductor chip, and a thermally conductive material present between the radiator and the semiconductor chip. The electronic apparatus further includes an insulating portion covering the conductor element. The thermally conductive material has electric conductivity and has fluidity at least at a time of operation of the semiconductor chip. A distance from at least a part of an upper surface of the insulating portion to a lower surface of the radiator is larger than a distance from an upper surface of the semiconductor chip to the lower surface of the radiator. According to this electronic apparatus, a range over which the thermally conductive material spreads can be limited to a region in which the conductor element is not present. In addition, adhesion between the radiator and the semiconductor chip can be secured.

An example of a semiconductor device proposed in the present disclosure includes a semiconductor chip, a substrate that is disposed on a lower side of the semiconductor chip and has a first region as a region in which the semiconductor chip is mounted and a second region as a region in which a conductor element including at least one of a circuit pattern and an electric part is disposed, and an insulating sheet covering the conductor element. According to this semiconductor device, a range over which a thermally conductive material spreads can be limited to a region in which the conductor element is not present.

Another example of the semiconductor device proposed in the present disclosure includes a semiconductor chip, a substrate that is disposed on a lower side of the semiconductor chip and has a first region as a region in which the semiconductor chip is mounted and a second region as a region in which a conductor element including at least one of a circuit pattern and an electric part is disposed, and an insulating portion covering the conductor element. A height of at least a part of an upper surface of the insulating portion with respect to the substrate is smaller than a height of the upper surface of the semiconductor chip with respect to the substrate. According to this semiconductor device, a range over which a thermally conductive material spreads can be limited to a region in which the conductor element is not present. In addition, adhesion between a radiator and the semiconductor chip can be secured.

An insulating sheet proposed in the present disclosure is an insulating sheet for attachment to a semiconductor device including a semiconductor chip and a substrate disposed on a lower side of the semiconductor chip, the substrate having a first region as a region in which the semiconductor chip is mounted and a second region as a region in which a conductor element including at least one of a circuit pattern and an electric part is disposed. The insulating sheet includes a housing portion configured to cover the conductor element, the housing portion having a top wall located on an upper side of the conductor element and an inner wall that is located on an inside of the top wall and descends from the top wall, and an attachment target portion connected to the inner wall and located at a position lower than the top wall. According to this insulating sheet, a range over which a thermally conductive material spreads can be limited to a region in which the conductor element is not present. In addition, the insulating sheet can be attached to the substrate relatively easily even in a case where a difference in height between the conductor element and the semiconductor chip is small.

An example of a semiconductor device manufacturing method proposed in the present disclosure includes a step of preparing a substrate that is disposed on a lower side of the semiconductor chip and has a first region as a region in which the semiconductor chip is mounted and a second region as a region in which a conductor element including at least one of a circuit pattern and an electric part is disposed, and a step of covering the conductor element by an insulating portion. In the step of covering the conductor element by the insulating portion, a height of an upper surface of the insulating portion with respect to the substrate is made smaller than a height of an upper surface of the semiconductor chip with respect to the substrate. According to this method, a range over which a thermally conductive material spreads can be limited to a region in which the conductor element such as the electric part is not present. In addition, adhesion between a radiator and the semiconductor chip can be secured.

DESCRIPTION OF EMBODIMENT

A semiconductor device and an electronic apparatus proposed in the present disclosure will hereinafter be described. In the present specification, a semiconductor device 10 and an electronic apparatus 1 will be described as an example of the semiconductor device and the electronic apparatus proposed in the present disclosure. The electronic apparatus proposed in the present disclosure is, for example, applicable to a game machine, a development machine for executing various programs (for example, game programs) under development, and an information processing device (for example, a personal computer, a server apparatus, or a control device of a transportation vehicle) different from a game machine.

In the following description, a direction indicated by X1-X2 in FIG. 1 will be referred to as a horizontal direction, and directions indicated by Z1 and Z2 will be referred to as an upward direction and a downward direction, respectively. These directions are used to describe relative positional relations between elements (parts, members, and portions) of the electronic apparatus 1, and do not define the attitude of the electronic apparatus 1 during usage.

Figure 1A:
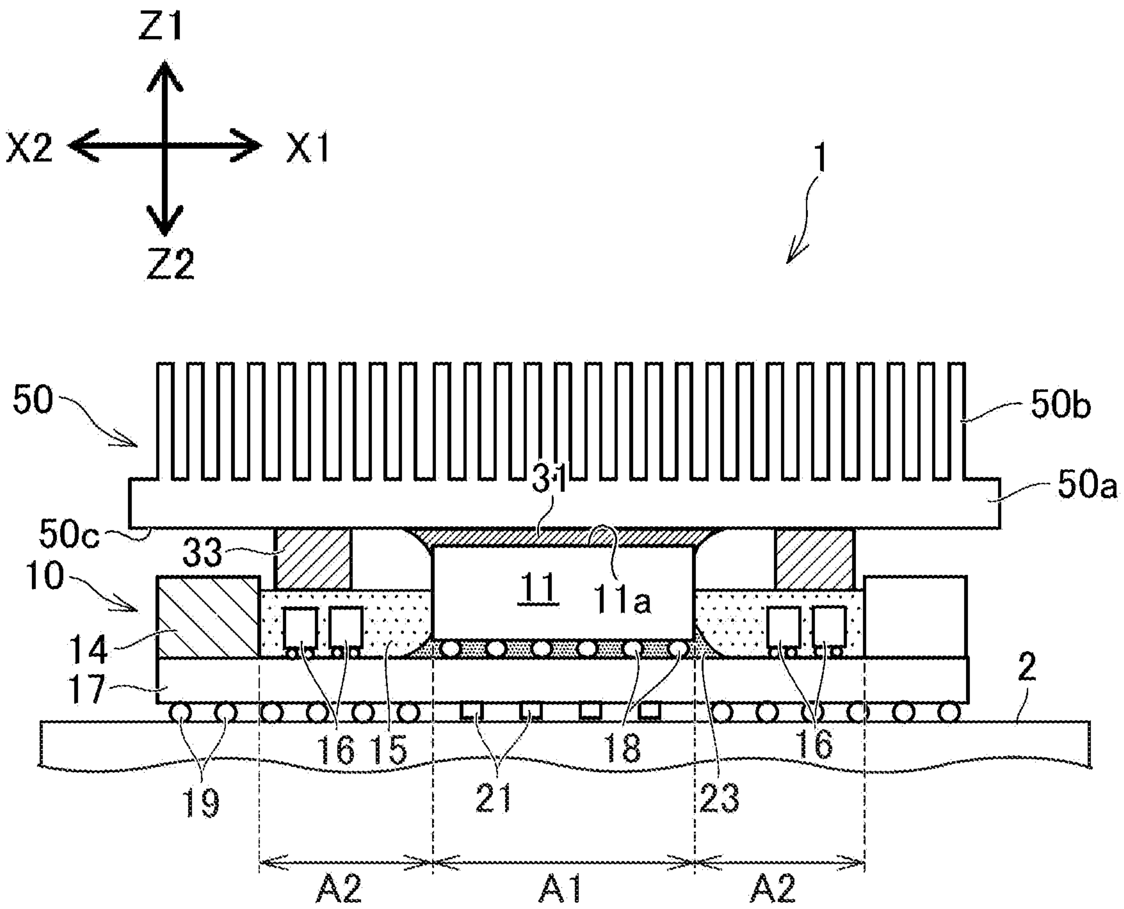
FIG. 1A is a sectional view illustrating an example of an electronic apparatus proposed in the present disclosure.

[Basic Configuration] As illustrated in FIG. 1A, the electronic apparatus 1 includes the semiconductor device 10, a circuit board 2, and a radiator 50. In description in the present specification, the circuit board 2 is disposed on the lower side of the semiconductor device 10, and the radiator 50 is disposed on the upper side of the semiconductor device 10.

The semiconductor device 10 includes a semiconductor chip 11 and a substrate (package substrate) 17 located on the lower side of the semiconductor chip 11. The semiconductor chip 11 functions as a CPU, a GPU, or the like. The semiconductor chip 11 is, for example, flip-chip mounted on an upper surface 17*a* (see FIG. 1B) of the substrate 17. That is, a plurality of solder bumps 18 formed on the lower surface of the semiconductor chip 11 are soldered to bumps (not illustrated) formed on the substrate 17. A gap between the semiconductor chip 11 and the substrate 17 is filled with an underfill 23. The underfill 23 is formed by a resin, for example. The underfill 23 is cured between the semiconductor chip 11 and the substrate 17. A method of mounting the semiconductor chip 11 onto the substrate 17 may be wire bonding, tape bonding, or the like.

In addition to the semiconductor chip 11, a plurality of electric parts are mounted on the upper surface 17*a* of the substrate 17. In the example illustrated in FIG. 1A and FIG. 1B, a plurality of capacitors 16 are mounted on the substrate 17. In the present specification, in the semiconductor device 10, a region in which the semiconductor chip 11 is disposed will be referred to as a first region A1 (see FIG. 1A and FIG. 2), and a region on the periphery of the semiconductor chip 11 in which region the plurality of electric parts such as the capacitors 16 are arranged will be referred to as a second region A2 (see FIG. 1A and FIG. 2). A circuit pattern (including through holes or vias) may be formed in the second region A2 in addition to the mounting of the capacitors 16 or in place of the mounting of the capacitors 16. A stiffener 14 to be described later is attached to the peripheral edge of the substrate 17. The second region A2 is a region between the inner surface of the stiffener 14 and the side surface of the semiconductor chip 11. An insulating portion 15 to be described later is formed in the second region A2.

The stiffener 14 is a square frame formed by a metal. The stiffener 14 is attached to the peripheral edge of the substrate 17. Usable as a material for the stiffener 14 is, for example, aluminum, copper, or the like. An adhesive or solder may be used for the attachment of the stiffener 14 to the substrate 17. The stiffener 14 can reduce a warp in the substrate 17. The first region A1 and the second region A2 are defined on the inside of the stiffener 14.

As illustrated in FIG. 1A, the substrate 17 is mounted on the circuit board 2 included in the electronic apparatus 1. A Ball Grid Array (BGA) 19, for example, is formed on the lower surface of the substrate 17. That is, a plurality of solder bumps arranged in a lattice manner are formed on the lower surface of the substrate 17. The BGA 19 is soldered to a conductor pad formed on the circuit board 2. A method of mounting the substrate 17 onto the circuit board 2 is not necessarily limited to a method using the BGA 19, but various other mounting methods may be adopted as the method of mounting the substrate 17 onto the circuit board 2. For example, a Pin Grid Array (PGA) provided with pin-shaped lead terminals or a Land Grid Array (LGA) having electrodes arranged in the shape of an array may be used. A plurality of capacitors 21 may be mounted on the lower surface of the substrate 17 in addition to the BGA 19.

The radiator 50 is, for example, a heat sink. As illustrated in FIG. 1A, the radiator 50 includes a plate-shaped heat receiving portion 50*a* and fins 50*b*. The fins 50*b* are, for example, formed on the upper side of the heat receiving portion 50*a*. A vapor chamber formed by a plate-shaped container and a hydraulic fluid contained in the container may be used as the heat receiving portion 50*a*. As still another example, the radiator 50 may include a heat pipe. The radiator 50 may be biased toward the semiconductor chip 11 by an elastic member (for example, a spring) not illustrated. In addition, the electronic apparatus 1 may include a cooling fan not illustrated which forms an airflow toward the radiator 50.

[Thermally Conductive Material] As illustrated in FIG. 1A, a lower surface 50*c* of the radiator 50 is opposed to an upper surface 11*a* of the semiconductor chip 11. A thermally conductive material 31 is disposed between the lower surface 50*c* of the radiator 50 and the upper surface 11*a* of the semiconductor chip 11. The thermally conductive material 31 is in direct contact with the lower surface 50*c* of the radiator 50 and the upper surface 11*a* of the semiconductor chip 11. The radiator 50 and the semiconductor chip 11 are thermally connected to each other by the thermally conductive material 31.

The thermally conductive material 31 is a material having fluidity. More specifically, the thermally conductive material 31 is a material having fluidity at least at the time of operation of the semiconductor chip 11. Preferably, the thermally conductive material 31 is in a liquid or paste form at least at the time of operation of the semiconductor chip 11. The thermally conductive material 31 may be a material that does not have fluidity at the time of non-operation of the semiconductor chip 11 (in other words, at room temperature (for example, 20° C.)) though generating fluidity at the time of operation of the semiconductor chip 11. That is, the thermally conductive material 31 may be a material that generates fluidity by heat generated by the operation of the semiconductor chip 11. The time of non-operation of the semiconductor chip 11 is, for example, the time of manufacturing, the time of transportation, or a time during which power to the electronic apparatus is in an off state. Unlike this, the thermally conductive material 31 may be a material having fluidity also at the time of non-operation of the semiconductor chip 11. That is, the thermally conductive material 31 may be in any state such as a liquid form, a paste form, a powder form, a plate form, or a block form at the time of non-operation of the chip.

The fluidity of the thermally conductive material 31 reduces a thermal resistance between the upper surface 11*a* of the semiconductor chip 11 and the lower surface 50*c* of the radiator 50, the thermal resistance being caused by a slight warp in the upper surface 11*a* of the semiconductor chip 11 or microscopic unevenness of the lower surface 50*c* of the radiator 50. The fluidity of the thermally conductive material 31 can therefore improve the performance of cooling the semiconductor chip 11. Further, when the thermally conductive material 31 has fluidity at room temperature, the radiator 50 can be separated from the semiconductor chip 11. As a result, at the time of repairing the electronic apparatus 1, for example, repair work can be performed after the radiator 50 is removed from the semiconductor device 10. In addition, the thermally conductive material 31 is a material having electric conductivity, or in other words, a material having high thermal conductivity.

A liquid metal, which is a liquid at room temperature, for example, can be used as the thermally conductive material 31. Usable as the liquid metal are, for example, one or more kinds of low melting point metals selected from a group including Ga (melting point: 29.8° C., thermal conductivity: 40.6 W/mk), In (melting point: 156.4° C., thermal conductivity: 81.6 W/mk), and Sn (melting point: 231.97° C., thermal conductivity: 66.6 W/mk) or alloys containing the one or more kinds of low melting point metals. Concrete examples of the alloys include In—Ag, Sn—Ag—Cu, In—Sn—Bi, and the like. An electrically conductive paste may be used as another example of the thermally conductive material 31. A silver paste obtained by dispersing silver powder in a resin can be used as the electrically conductive paste.

The thermally conductive material 31 is preferably applied to an entire region of the upper surface 11*a* of the semiconductor chip 11. The thermally conductive material 31 may be in contact with a part of a side surface 11*b* (see FIG. 1B) of the semiconductor chip 11. A region in the lower surface 50*c* of the radiator 50 to which region the thermally conductive material 31 is applied may be larger than the semiconductor chip 11.

[Seal Member and Insulating Portion] Because the thermally conductive material 31 has fluidity, a range over which the thermally conductive material 31 spreads needs to be limited in order to exert cooling performance. In addition, because the thermally conductive material 31 has electric conductivity, the range over which the thermally conductive material 31 spreads needs to be limited so as to prevent the thermally conductive material 31 from touching the capacitors 16 and the circuit pattern provided in the second region A2. In addition, it is undesirable for the thermally conductive material 31 to come into contact with another part of the electronic apparatus 1 which part is located on the outside of the semiconductor device 10 (outside of the stiffener 14). Accordingly, the electronic apparatus 1 has the following structure.

Figure 1B:
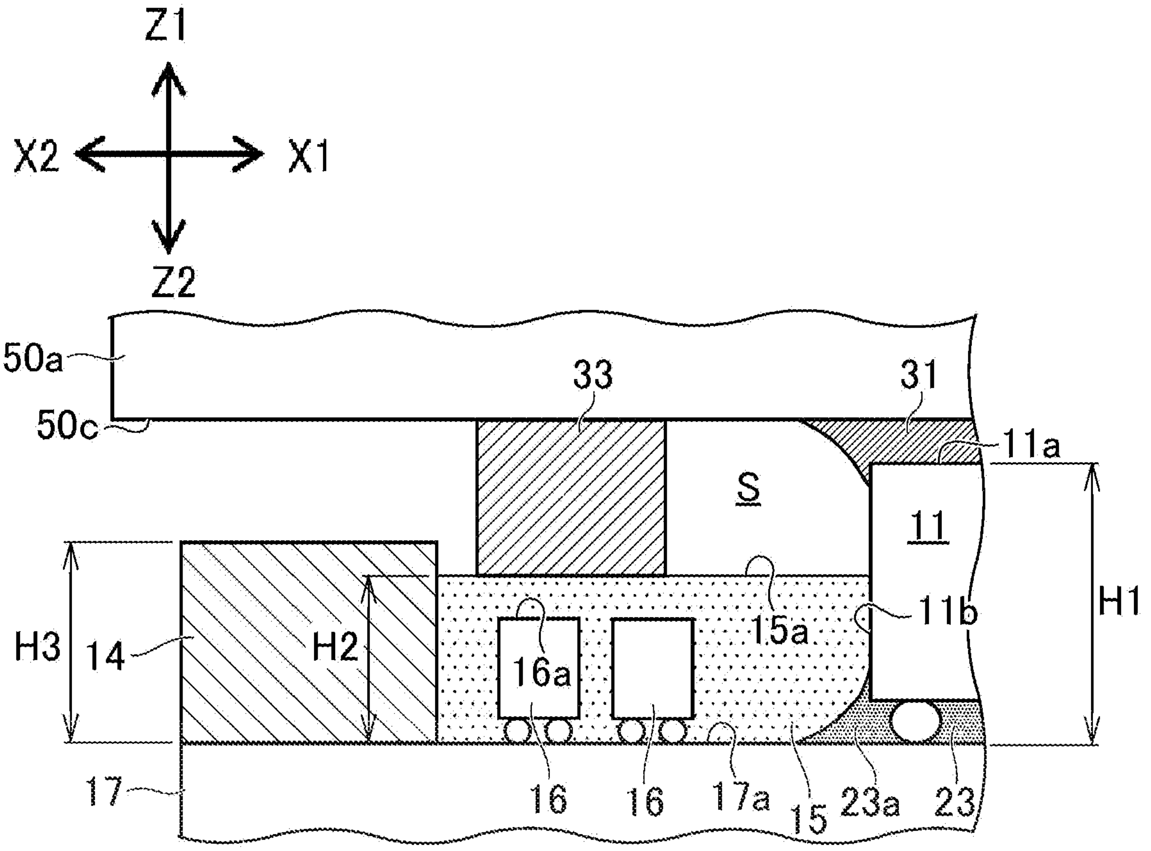
FIG. 1B is an enlarged view of principal parts illustrated in FIG. 1A.
Figure 2:
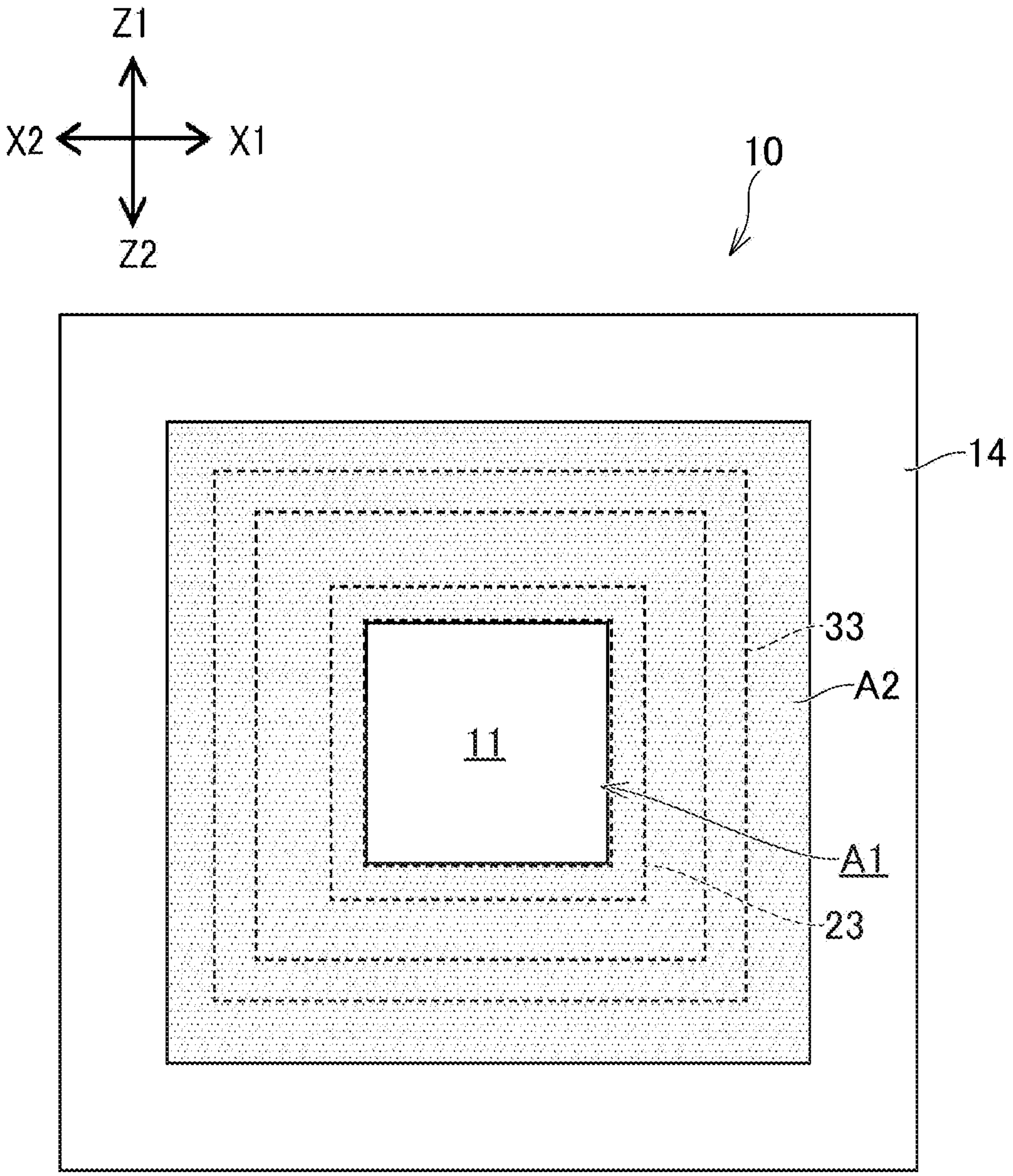
FIG. 2 is a plan view of a semiconductor device included in an electronic apparatus.

[Insulating Portion] As illustrated in FIG. 1A, the semiconductor device 10 has the insulating portion 15 that covers conductor elements provided in the second region A2 (see FIG. 2), that is, the capacitors 16 and the circuit pattern. In the example of the semiconductor device 10, as illustrated in FIG. 1B, the insulating portion 15 is formed between the inner surface of the stiffener 14 and the side surface 11*b* of the semiconductor chip 11. The insulating portion 15 is formed in the whole of the second region A2 and is in contact with the inner surface of the stiffener 14 and the side surface 11*b* of the semiconductor chip 11. Therefore, an inner peripheral portion of the insulating portion 15 is superposed on the upper side of a peripheral portion 23*a* (see FIG. 1B) of the underfill 23 formed between the semiconductor chip 11 and the substrate 17. The insulating portion

15 is not formed in the first region A1. The upper surface 11*a* of the semiconductor chip 11 is exposed from the insulating portion 15.

The insulating portion 15 is, for example, a resin. More specifically, the insulating portion 15 is a part obtained by curing a resin in a liquid or gel form. An ultraviolet curable resin, for example, can be used as the insulating portion 15. The resin is applied so as to cover the conductor elements in the second region A2 (that is, the capacitors 16 and the circuit pattern), and is thereafter cured by receiving ultraviolet rays to form the insulating portion 15. The insulating portion 15 can prevent the thermally conductive material 31 from touching the conductor elements present in the second region A2.

As illustrated in FIG. 1B, a height H2 of an upper surface 15*a* of the insulating portion 15 (height from the upper surface 17*a* of the substrate 17) is smaller than a height H1 of the upper surface 11*a* of the semiconductor chip 11 (height from the upper surface 17*a* of the substrate 17). Because of this, a distance from the upper surface 15*a* of the insulating portion 15 to the lower surface 50*c* of the radiator 50 is larger than a distance from the upper surface 11*a* of the semiconductor chip 11 to the lower surface 50*c* of the radiator 50. Therefore, when the radiator 50 is pressed toward the semiconductor chip 11, sufficient adhesion between the radiator 50 and the semiconductor chip 11 can be secured without interference occurring between the insulating portion 15 and the lower surface 50*c* of the radiator 50.

As illustrated in FIG. 1B, in the example of the semiconductor device 10, the height of upper surfaces 16*a* of the capacitors 16 (height from the upper surface 17*a* of the substrate 17) is smaller than the height H1 of the upper surface 11*a* of the semiconductor chip 11. The insulating portion 15 preferably covers the upper surfaces 16*a* of the capacitors 16. In other words, the whole of the capacitors 16 is preferably covered by the insulating portion 15. This can reliably prevent the thermally conductive material 31 from touching the capacitors 16. The whole of the capacitors 16 may be buried in the insulating portion 15.

In addition, as illustrated in FIG. 1B, a height H3 of an upper surface 14*a* of the stiffener 14 (height from the upper surface 17*a* of the substrate 17) is smaller than the height H1 of the upper surface 11*a* of the semiconductor chip 11. The height H2 of the upper surface 15*a* of the insulating portion 15 is smaller than the height H3 of the upper surface 14*a* of the stiffener 14. Therefore, when the radiator 50 is pressed toward the semiconductor chip 11, sufficient adhesion between the radiator 50 and the semiconductor chip 11 can be secured without interference occurring between the stiffener 14 and the lower surface 50*c* of the radiator 50. Unlike the example illustrated in FIG. 1B, the height H2 of the upper surface 15*a* of the insulating portion 15 may be the same as the height H3 of the upper surface 14*a* of the stiffener 14.

Figure 3A:
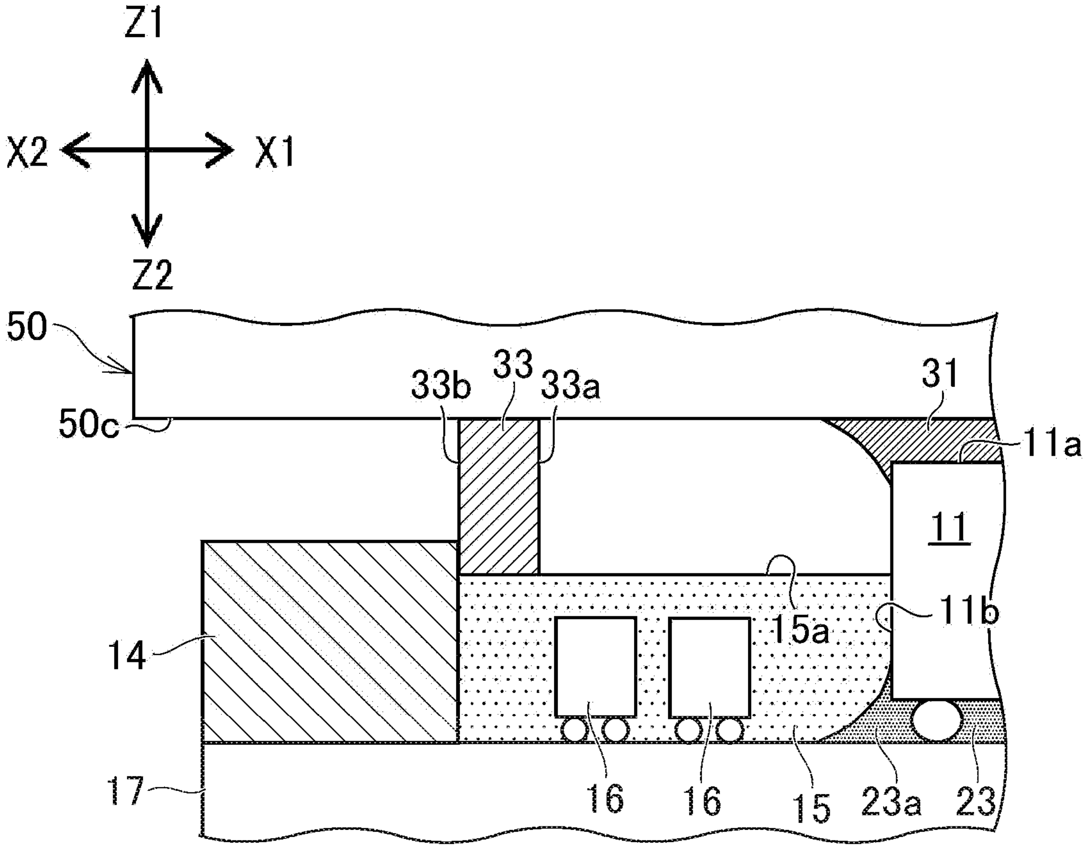
FIG. 3A is a sectional view illustrating a modification of the position of a seal member.

In a case where the conductor elements such as the circuit pattern and the capacitors 16 or the like exposed to the upper surface 17*a* of the substrate 17 are formed only in a part of the second region A2, the insulating portion 15 may be formed only in this part of the second region A2. For example, as illustrated in FIG. 3C, the insulating portion 15 may be separated from the side surface 11*b* of the semiconductor chip 11. In an example illustrated in this figure, a seal member 33 to be described later is disposed between the insulating portion 15 and the side surface 11*b* of the semiconductor chip 11. Such an insulating portion 15 may, for example, be a part obtained by curing a resin (specifically, an ultraviolet curable resin) in a liquid or gel form which resin is supplied between this seal member 33 and the stiffener 14.

[Seal Member] The electronic apparatus 1 has a seal member 33 that surrounds the thermally conductive material 31 (see FIG. 1A). A square opening as viewed in plan is formed in the seal member 33, and the thermally conductive material 31 and the semiconductor chip 11 are located on the inside of the seal member 33 (see FIG. 2). As illustrated in FIG. 1B, the seal member 33 is located between the semiconductor device 10 and the lower surface 50*c* of the radiator 50, seals a space between the semiconductor device 10 and the lower surface 50*c* of the radiator 50, and retains the thermally conductive material 31 within the semiconductor device 10. The seal member 33 is separated from the peripheral edge (side surface 11*b*) of the semiconductor chip 11. It is therefore possible to apply the thermally conductive material 31 described above to the whole of the upper surface 11*a* of the semiconductor chip 11. That is, the thermally conductive material 31 can be continuously applied as far as four edge portions of the upper surface 11*a*.

The seal member 33 is, for example, disposed between the upper surface 15*a* of the insulating portion 15 and the lower surface 50*c* of the radiator 50, and is sandwiched by the two surfaces 15*a* and 50*c*. The seal member 33 may be attached to the lower surface 50*c* of the radiator 50. The seal member 33 may, for example, be bonded to the lower surface 50*c* of the radiator 50. Conversely, the seal member 33 may be attached to the upper surface 15*a* of the insulating portion 15. The seal member 33 may, for example, be bonded to the upper surface 15*a* of the insulating portion 15.

In addition, the seal member 33 may have a part located above the capacitors 16 covered by the insulating portion 15. That is, the seal member 33 may have a part overlapping the capacitors 16 as viewed in plan of the semiconductor device 10. The semiconductor device 10 having such a positional relation makes it possible to adopt the seal member 33 having a large width in the horizontal direction, and thereby improve a sealing property. A space S in which air is present is formed on the inside of the seal member 33.

The seal member 33 is, for example, formed by a material having a cushioning characteristic. That is, the seal member 33 is formed by a material that allows a change in the thickness of the seal member 33 in a direction in which the upper surface 11*a* of the semiconductor chip 11 and the lower surface 50*c* of the radiator 50 face each other, that is, an upward-downward direction. A material for the seal member 33 is, for example, a rubber, a sponge, a resin having a foam forming property, silicone, or the like. This can reduce a load acting on the semiconductor device 10 through the seal member 33 even in a case where the radiator 50 is pressed toward the semiconductor chip 11 by an elastic member.

The position of the seal member 33 is not limited to the example illustrated in FIG. 1B. For example, as illustrated in FIG. 3A, the seal member 33 may be located between the upper surface 15*a* of the insulating portion 15 and the lower surface 50*c* of the radiator 50 and avoid the positions of the capacitors 16. That is, the seal member 33 may be disposed so as not to overlap the capacitors 16 as viewed in plan. This can prevent a load from acting on the capacitors 16 from the radiator 50 through the seal member 33.

Figure 3B:
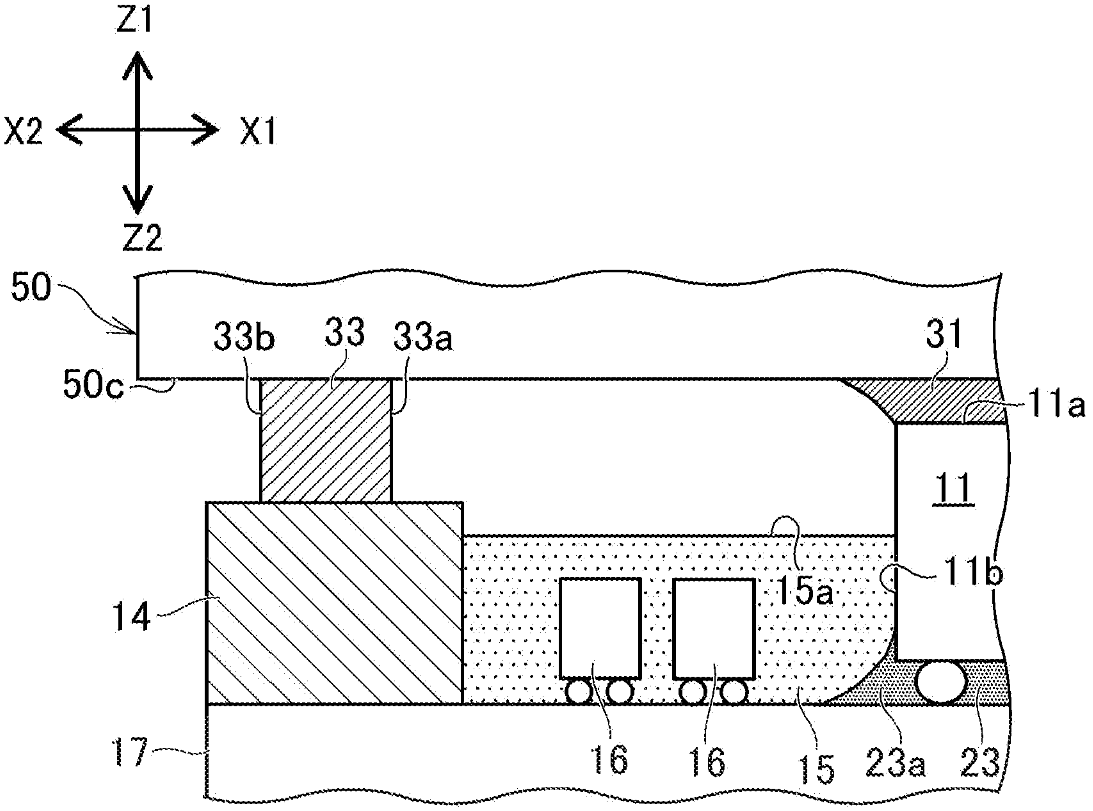
FIG. 3B is a sectional view illustrating a modification of the position of the seal member.
Figure 3C:
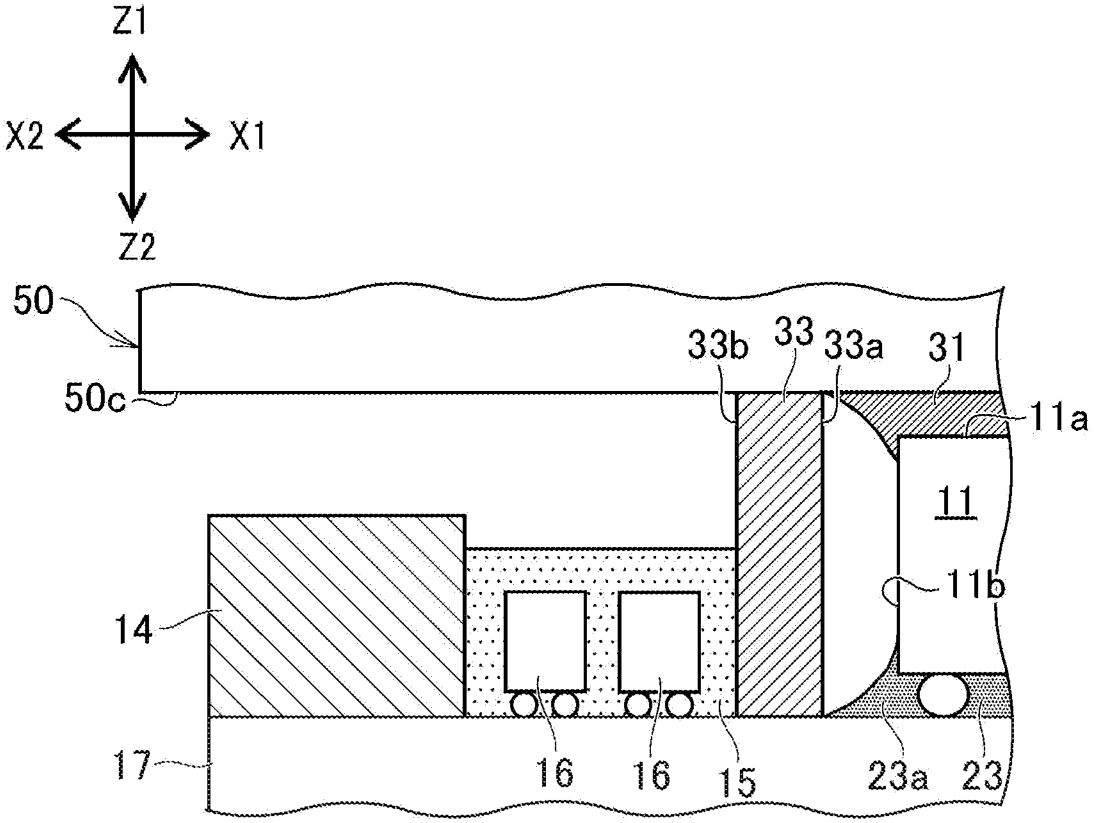
FIG. 3C is a sectional view illustrating a modification of the position of the seal member.

In still another example, as illustrated in FIG. 3B, the seal member 33 may be disposed between the upper surface 14*a* of the stiffener 14 and the lower surface 50*c* of the radiator 50 and sandwiched by the two surfaces 14*a* and 50*a*. The stiffener 14 is formed by a metal and has higher stiffness than the insulating portion 15. Because the seal member 33 is pressed against the stiffener 14 having high stiffness, contact pressure between the seal member 33 and the stiffener 14 can be enhanced. As a result, the sealing property of the seal member 33 can be improved.

As described above, the insulating portion 15 may be formed at the position of the capacitors 16 and separated from the side surface 11*b* of the semiconductor chip 11. In this case, as illustrated in FIG. 3C, the seal member 33 may be located on the inside of the insulating portion 15. Then, the seal member 33 may be disposed between the upper surface 17*a* of the substrate 17 and the lower surface 50*c* of the radiator 50 and sandwiched by the two surfaces 17*a* and 50*c*.

That is, it suffices for an inner peripheral surface 33*a* of the seal member 33 (surface surrounding the semiconductor chip 11) to be located outward of the outer edge of the semiconductor chip 11 and not to coincide with the semiconductor chip 11. It suffices for an outer peripheral surface 33*b* of the seal member 11 (surface facing an opposite side from the inner peripheral surface 33*a*) to be located inward of the outer edge of the semiconductor device 10 (outer edge of the stiffener 14 in the example of the semiconductor device 10).

[Manufacturing Method] An example of a method of manufacturing the electronic apparatus 1 and the semiconductor device 10 will be described.

First, the semiconductor chip 11, the capacitors 16, and the stiffener 14 are mounted on the substrate 17. The underfill 23 is filled between the semiconductor chip 11 and the substrate 17. An ultraviolet curable resin in a liquid or gel form is supplied to the peripheries of the capacitors 16. That is, the ultraviolet curable resin is accumulated between the stiffener 14 and the semiconductor chip 11. An amount of resin is such that the upper surfaces 16*a* of the capacitors 16 are buried in the resin. The resin is cured by irradiating the resin with ultraviolet rays. The insulating portion 15 is thereby obtained. Incidentally, in a case of manufacturing a structure in which the insulating portion 15 is formed between the seal member 33 and the stiffener 14 as illustrated in FIG. 3C, the insulating portion 15 can be formed by supplying an ultraviolet curable resin in a liquid or gel form between the seal member 33 and the stiffener 14 after the seal member 33 is attached to the substrate 17.

Figure 4:
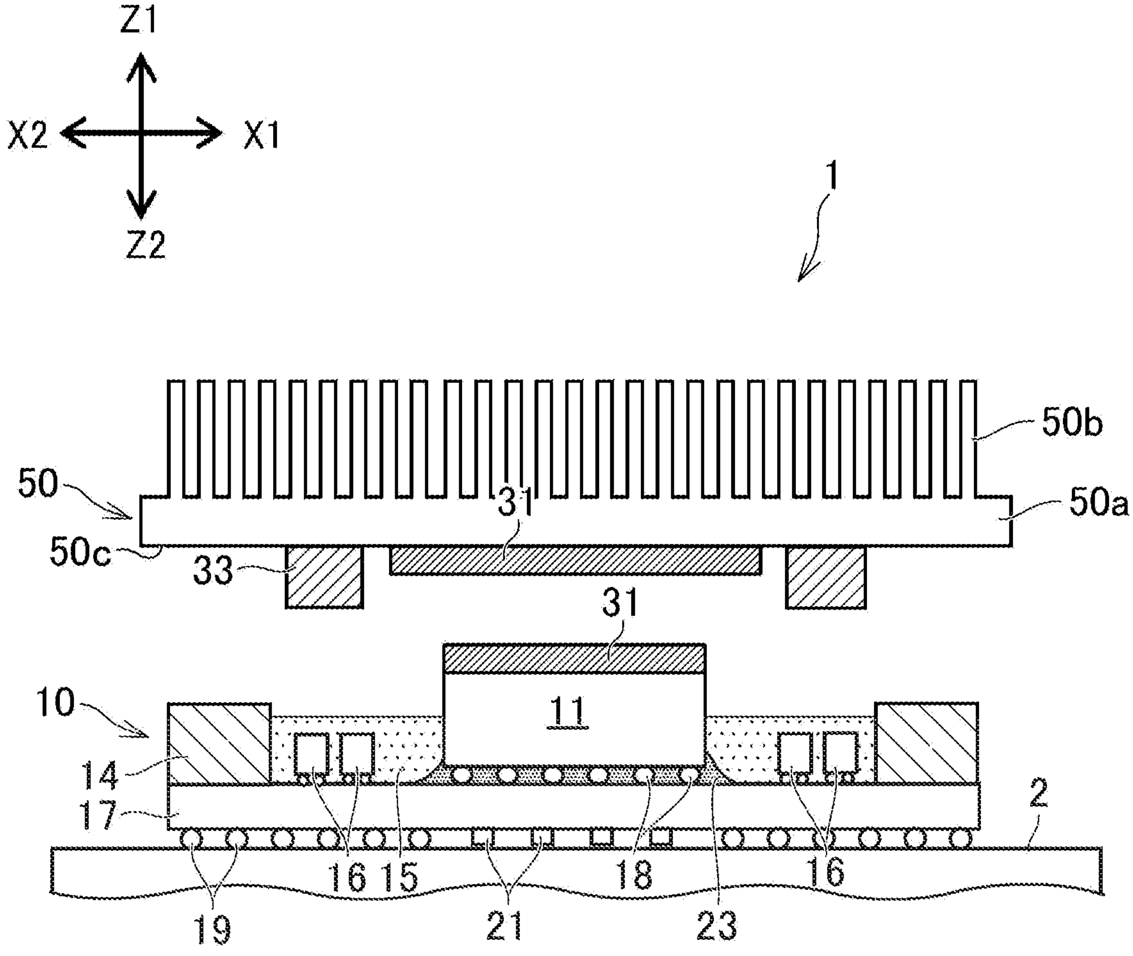
FIG. 4 is a diagram of assistance in explaining a step of manufacturing the electronic apparatus.

Next, as illustrated in FIG. 4, the thermally conductive material 31 is applied to the upper surface 11*a* of the semiconductor chip 11 and the lower surface 50*c* of the radiator 50. It is preferable to spread the thermally conductive material 31 over the whole of the upper surface 11*a* of the semiconductor chip 11 by using the fluidity of the thermally conductive material 31. In addition, it is preferable to spread the thermally conductive material 31 over the whole of a region corresponding to the semiconductor chip 11 in the lower surface 50*c* of the radiator 50. The region on the radiator 50 to which region the thermally conductive material 31 is applied is preferably larger than the size of the semiconductor chip 11.

In addition, the seal member 33 is affixed to the lower surface 50*c* of the radiator 50. Then, the radiator 50 is attached to the semiconductor chip 11. The radiator 50 is pressed to the semiconductor chip 11 by using an elastic member such as a spring. Consequently, the lower surface 50*c* of the radiator 50 closely adheres to the upper surface 11*a* of the semiconductor chip 11.

Incidentally, in a method of applying the thermally conductive material 31 to only one of the upper surface 11*a* of the semiconductor chip 11 and the lower surface 50*c* of the radiator 50, the thermally conductive material 31 does not readily spread on the other surface when the radiator 50 is attached to the semiconductor chip 11, and thus a thermal resistance between the semiconductor chip 11 and the radiator 50 becomes larger. Such a problem can be solved by applying the thermally conductive material 31 to the upper surface 11*a* of the semiconductor chip 11 and the lower surface 50*c* of the radiator 50 as illustrated in FIG. 4.

Figure 5A:
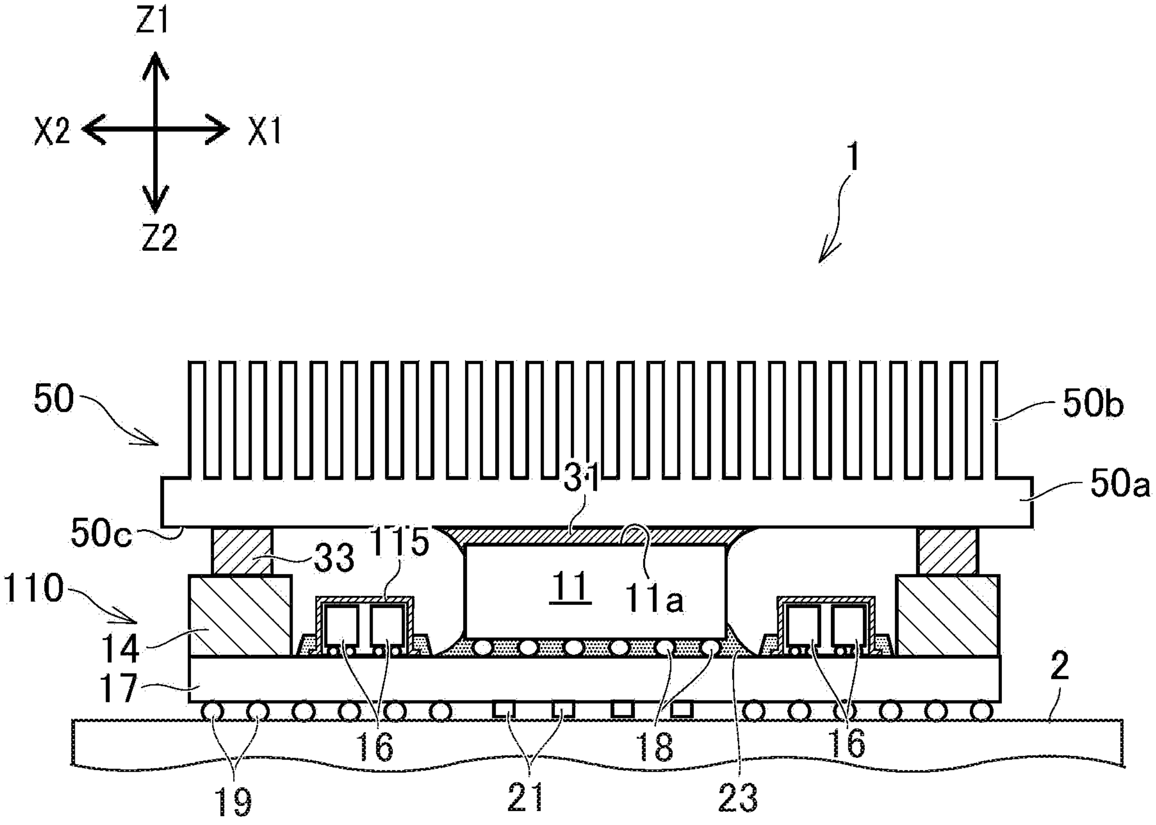
FIG. 5A is a sectional view illustrating another example of the electronic apparatus proposed in the present disclosure.
Figure 5B:
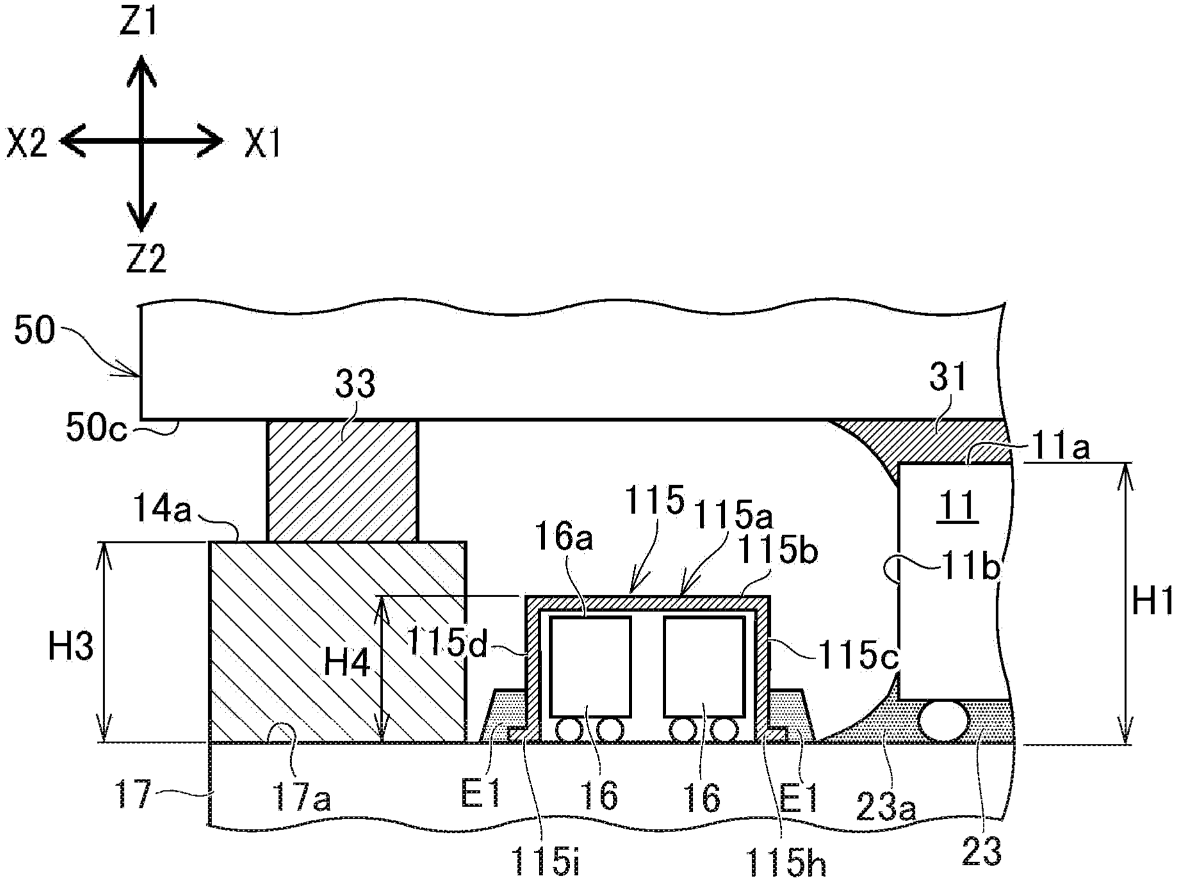
FIG. 5B is an enlarged view of FIG. 5A.

[Modifications] FIG. 5A is a sectional view illustrating a modification of the electronic apparatus 1. FIG. 5B is an enlarged view of FIG. 5A. In these figures, the electronic apparatus 1 has a semiconductor device 110 as a modification of the semiconductor device 10. In the figures, the same parts as the parts or members described thus far are identified by the same reference numerals.

Figure 6:
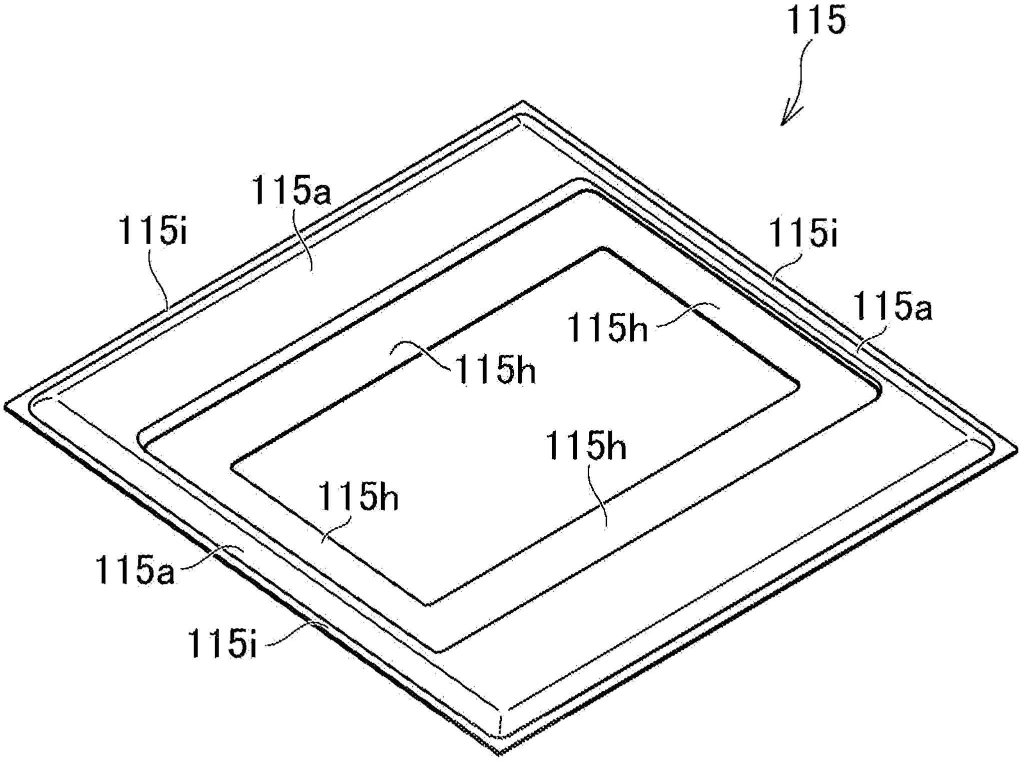
FIG. 6 is a perspective view of an insulating sheet included in the electronic apparatus illustrated in FIG. 5A.

The semiconductor device 110 has an insulating sheet 115 (see FIG. 5A) as an insulating portion that covers conductor elements such as the capacitors 16 and the circuit pattern or the like. The insulating sheet 115 is a sheet formed by a resin. Usable as a material for the insulating sheet 115 is, for example, an engineering plastic such as polycarbonate or polyamide. FIG. 6 is a perspective view of the insulating sheet 115. FIG. 5A and FIG. 5B illustrate the insulating sheet 115 reduced in width in a left-right direction as compared with the insulating sheet 115 illustrated in FIG. 6.

As illustrated in FIG. 5B, the insulating sheet 115 has a housing portion 115*a*. The capacitors 16 are arranged within the housing portion 115*a* (space defined by the housing portion 115*a* and the upper surface 17*a* of the substrate 17). The housing portion 115*a* has a top wall 115*b*, an inner wall 115*c*, and an outer wall 115*d*. The top wall 115*b* is located on the upper side of the capacitors 16. The inner wall 115*c* is located on the inside of the capacitors 16 (that is, located nearer the center of the semiconductor device 10 than the capacitors 16), and descends from the top wall 115*b* toward the substrate 17. The outer wall 115*d* is located on the outside of the capacitors 16 and descends from the top wall 115*b* toward the substrate 17. Hence, a space in which the capacitors 16 are arranged is formed within the housing portion 115*a*.

[Height of Housing Portion] As illustrated in FIG. 5B, a height H4 of a highest part of the upper surface of the insulating sheet 115 (highest part of the upper surface of the top wall 115*b*) is smaller than the height H1 of the upper surface 11*a* of the semiconductor chip 11. Because of this, a distance from the upper surface of the insulating sheet 115 to the lower surface 50*c* of the radiator 50 is larger than a distance from the upper surface 11*a* of the semiconductor chip 11 to the lower surface 50*c* of the radiator 50. Therefore, when the radiator 50 is pressed toward the semiconductor chip 11, sufficient adhesion between the radiator 50 and the semiconductor chip 11 can be secured without interference occurring between the insulating sheet 115 and the lower surface 50*c* of the radiator 50.

As illustrated in FIG. 5B, the height H3 of the upper surface 14*a* of the stiffener 14 is smaller than the height H1 of the upper surface 11*a* of the semiconductor chip 11. The height H4 of the upper surface of the insulating sheet 115 is smaller than the height H3 of the upper surface 14*a* of the stiffener 14. When the radiator 50 is pressed toward the semiconductor chip 11, sufficient adhesion between the radiator 50 and the semiconductor chip 11 can be secured without interference occurring between the stiffener 14 and the lower surface 50*c* of the radiator 50. Unlike the example illustrated in FIG. 5B, the height H4 of the upper surface of the insulating sheet 115 may be the same as the height H3 of the upper surface 14*a* of the stiffener 14.

Incidentally, a metallic plate having a size adapted to the size of the semiconductor chip 11 may be welded to the lower surface 50*c* of the radiator 50. In this case, the height H4 of the upper surface of the insulating sheet 115 may be higher than the height H1 of the upper surface 11*a* of the semiconductor chip 11. According to this structure, the distance from the upper surface of the insulating sheet 115 to the lower surface 50*c* of the radiator 50 can be made larger than the distance from the upper surface 11*a* of the semiconductor chip 11 to the lower surface of the radiator 50 (lower surface of the metallic plate) by adjusting the thickness of the metallic plate. As a result, sufficient adhesion between the radiator 50 and the semiconductor chip 11 can be secured without interference occurring between the insulating sheet 115 and the lower surface 50*c* of the radiator 50.

[Attachment Target Portion] As illustrated in FIG. 5B, the insulating sheet 115 is attached to the semiconductor device 110. In an example, the insulating sheet 115 has attachment target portions 115*h* and 115*i* that constitute edges of the housing portion 115*a* and are attached to the substrate 17. The attachment target portions 115*h* and 115*i* are attached to the substrate 17 by an adhesive E1. An ultraviolet curable resin, for example, can be used as the adhesive E1.

As illustrated in FIG. 5B, the inner attachment target portion 115*h* is connected to a lower end of the inner wall 115*c*. The attachment target portion 115*h*, for example, extends in the horizontal direction from a lower edge of the inner wall 115*c*, and is disposed along the substrate 17. Then, the attachment target portion 115*h* is located between the capacitors 16 and the side surface 11*b* of the semiconductor chip 11. The position of the attachment target portion 115*h* is lower than the top wall 115*b* of the housing portion 115*a*. This shape of the insulating sheet 115 facilitates work for insulating the capacitors 16 from the thermally conductive material 31. That is, the structure illustrated in FIG. 1A presents a problem of a difficulty in managing a height to which to inject a resin so as not to exceed the upper surface 15*a* of the insulating portion 15 in a case where a difference between the height of the upper surfaces 16*a* of the capacitors 16 and the height of the upper surface 11*a* of the semiconductor chip 11 is small. On the other hand, the shape of the insulating sheet 115 having the attachment target portion 115*h* at a position lower than the top wall 115*b* makes it possible to attach the insulating sheet 115 to the semiconductor device 10 easily even when the difference between the height of the upper surfaces 16*a* of the capacitors 16 and the height of the upper surface 11*a* of the semiconductor chip 11 is small. In addition, the attachment target portion 115*h* extends in a direction along the top surface of the substrate 17. A strength of attachment of the attachment target portion 115*h* to the substrate 17 can therefore be increased. Incidentally, the attachment target portion 115*h* may not extend in the direction along the top surface of the substrate 17. In this case, the lower edge of the inner wall 115*c* may be bonded to the substrate 17, and function as the attachment target portion 115*h*.

As illustrated in FIG. 5B, the outer attachment target portion 115*i* is connected to a lower edge of the outer wall 115*d*. The attachment target portion 115*i*, for example, extends in the horizontal direction from the lower edge of the outer wall 115*d*, and is disposed along the substrate 17. The position of the attachment target portion 115*i* is also lower than the top wall 115*b*. This shape of the insulating sheet 115 facilitates work for insulating the capacitors 16 from the thermally conductive material 31. That is, the structure illustrated in FIG. 1A has a problem of a difficulty in managing a height to which to inject a resin so as not to exceed the upper surface 15*a* of the insulating portion 15 in a case where a difference between the height of the upper surfaces 16*a* of the capacitors 16 and the height of the upper surface 14*a* of the stiffener 14 is small. On the other hand, the shape of the insulating sheet 115 having the attachment target portion 115*i* at a position lower than the top wall 115*b* makes it possible to attach the insulating sheet 115 to the semiconductor device 10 easily even when the difference between the height of the upper surfaces 16*a* of the capacitors 16 and the height of the upper surface 14*a* of the stiffener 14 is small. In addition, the attachment target portion 115*i* extends in the direction along the top surface of the substrate 17. A strength of attachment of the attachment target portion 115*i* to the substrate 17 can therefore be increased. Incidentally, the attachment target portion 115*i* may not extend in the direction along the top surface of the substrate 17. In this case, the lower edge of the outer wall 115*d* may be bonded to the substrate 17, and function as the attachment target portion 115*i*.

In the structure illustrated in FIG. 5B, the inner attachment target portion 115*h* is in direct contact with the upper surface 17*a* of the substrate 17. However, the attachment target portion 115*h* may be indirectly attached to the substrate 17. For example, the attachment target portion 115*h* may be disposed on the upper side of the peripheral portion 23*a* of the underfill 23 and bonded to the underfill 23. As still another example, the attachment target portion 115*h* may be formed on the lower side of the underfill 23, and attached to the upper surface 17*a* of the substrate 17 by the underfill 23. This structure can reduce work processes for bonding the attachment target portion 115*h*.

The attachment target portions 115*h* and 115*i* are provided to the whole of edges of the housing portion 115*a*, and the inside of the housing portion 115*a* is sealed. As illustrated in FIG. 6, the insulating sheet 115 is, for example, of a rectangular shape in which an opening for disposing the semiconductor chip 11 is formed on the inside. The insulating sheet 115, for example, has four housing portions 115*a* along four respective side surfaces 11*b* of the semiconductor chip 11. The insulating sheet 115 has attachment target portions 115*h* along the whole of inner peripheral edges thereof and has attachment target portions 115*i* along the whole of outer peripheral edges thereof. Incidentally, the positions of the attachment target portions 115*h* and 115*i* are not limited to this. For example, an edge of the insulating sheet 115 may not be attached to the substrate 17 at a position where insulation is not necessary.

The shape of the insulating sheet 115 is not limited to the example illustrated in FIG. 6. For example, in a case where electric parts such as the capacitors 16 are present only in one direction or two directions with respect to the semiconductor chip 11, the insulating sheet 115 may not have the shape surrounding the semiconductor chip 11. For example, the insulating sheet 115 may be present only on one or two sides of the right side, left side, front side, and rear side of the semiconductor chip 11.

Figure 7:
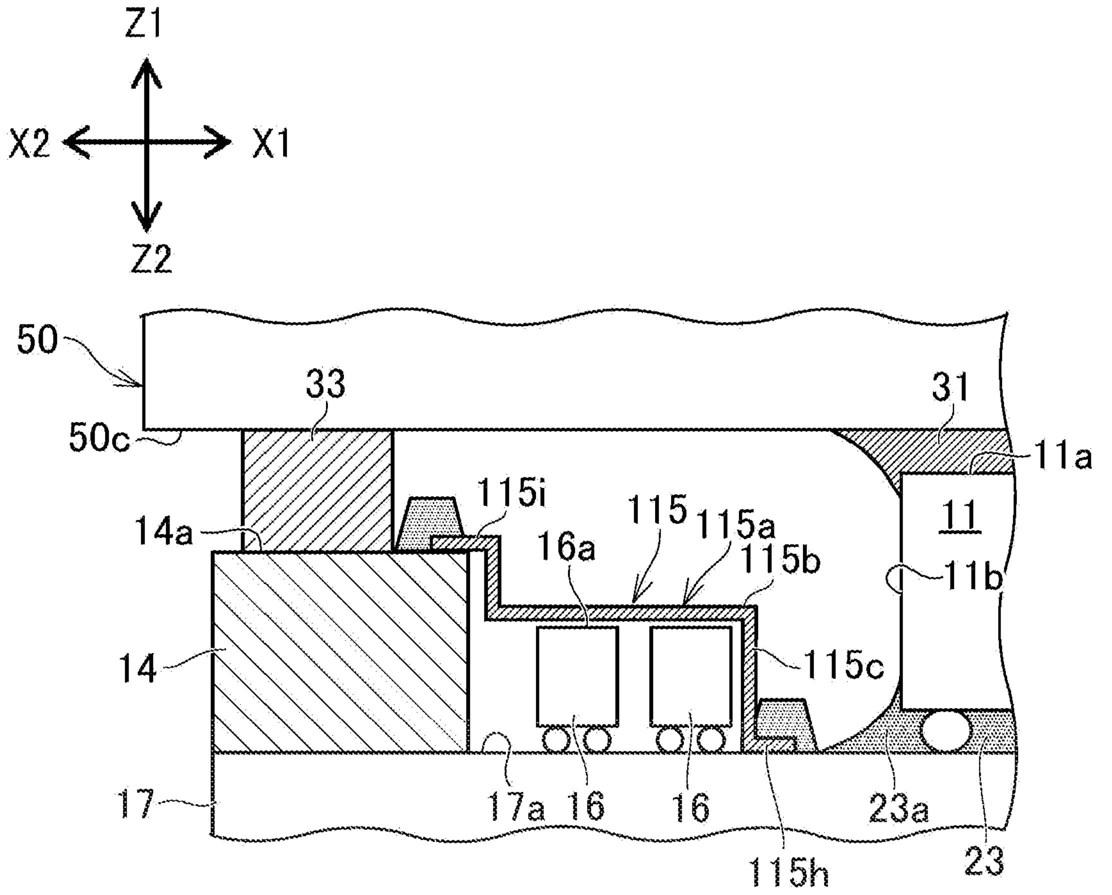
FIG. 7 is a diagram illustrating a modification of an insulating sheet attachment structure.

In the structure illustrated in FIG. 5B, the outer attachment target portion 115*i* is in direct contact with the upper surface 17*a* of the substrate 17. However, the attachment target portion 115*i* may be indirectly attached to the substrate 17. For example, as illustrated in FIG. 7, the attachment target portion 115*i* may be located on the upper surface 14*a* of the stiffener 14. Then, the attachment target portion 115*i* may be bonded to the upper surface 14*a*. In this case, the position of the attachment target portion 115*i* is preferably lower than the upper surface 11*a* of the semiconductor chip 11. This can secure adhesion between the radiator 50 and the semiconductor chip 11 because the attachment target portion 115*i* does not interfere with the radiator 50 when the radiator 50 is pressed to the semiconductor chip 11.

Figure 8:
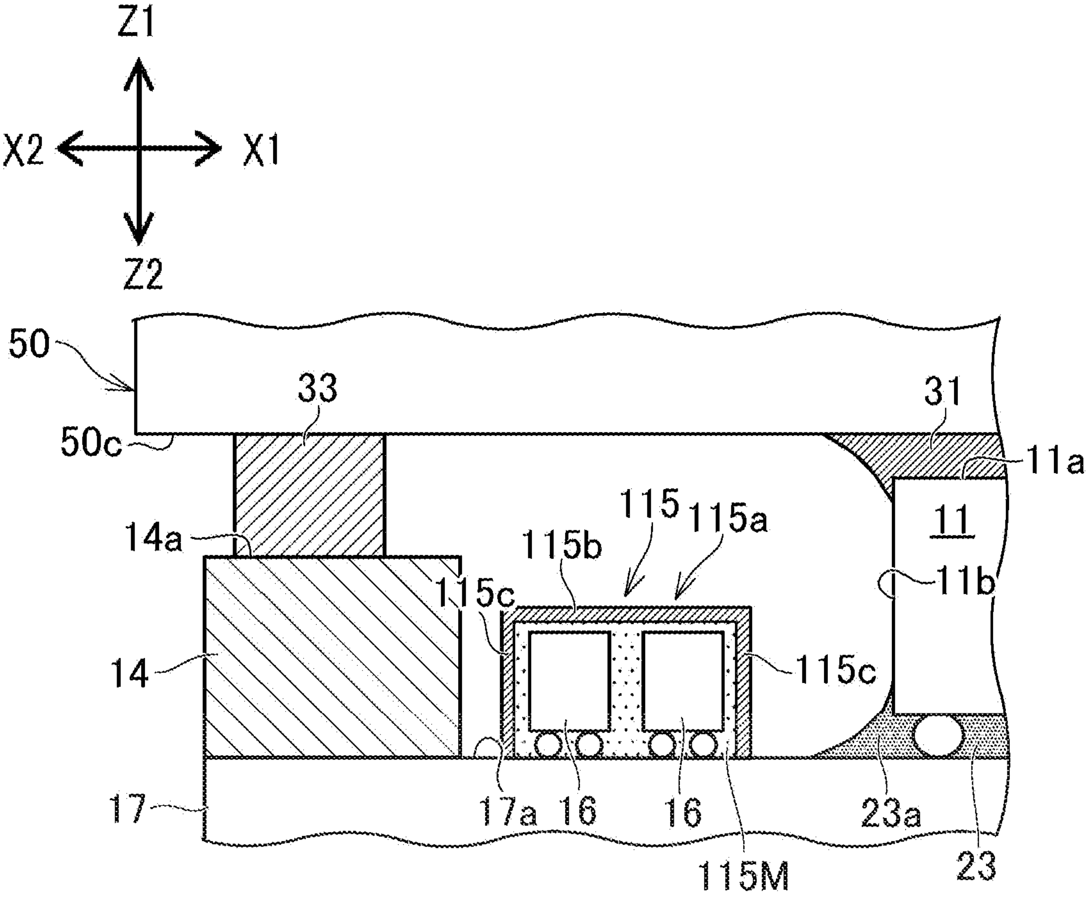
FIG. 8 is a diagram illustrating another modification of the insulating sheet attachment structure.

In yet another example, the insulating sheet 115 may not have the attachment target portions 115*i* and 115*h*. For example, as illustrated in FIG. 8, an insulating material may be filled into the housing portion 115*a* of the insulating sheet 115. The insulating material 115M may be a material functioning as an adhesive (for example, an ultraviolet curable resin). Then, the insulating sheet 115 is attached to the substrate 17 by the insulating material 115M.

[Seal Member] In the examples illustrated in FIG. 5A, FIG. 7, and FIG. 8, the seal member 33 is disposed between the upper surface 14*a* of the stiffener 14 and the lower surface 50*c* of the radiator 50 and is sandwiched by the two surfaces 14*a* and 50*c*. The stiffener 14 is formed by a metal and has higher stiffness than the insulating sheet 115. Because the seal member 33 is pressed against the stiffener 14 having high stiffness, contact pressure between the seal member 33 and the stiffener 14 can be enhanced. As a result, the sealing property of the seal member 33 can be improved.

[Manufacturing Method] An example of a method of manufacturing the semiconductor device 110 and the electronic apparatus 1 including the semiconductor device 110 will be described. First, the semiconductor chip 11, the capacitors 16, and the stiffener 14 are mounted on the substrate 17. The underfill 23 is filled between the semiconductor chip 11 and the substrate 17. Next, the capacitors 16 are covered by the insulating sheet 115. Then, an adhesive is applied to the attachment target portions 115*h* and 115*i* and is cured. The inside of the housing portion 115*a* is thereby sealed. An ultraviolet curable resin can be used as the adhesive. The following processes may be the same as processes for manufacturing the semiconductor device 10 and the electronic apparatus 1 including the semiconductor device 10.

Figure 9A:
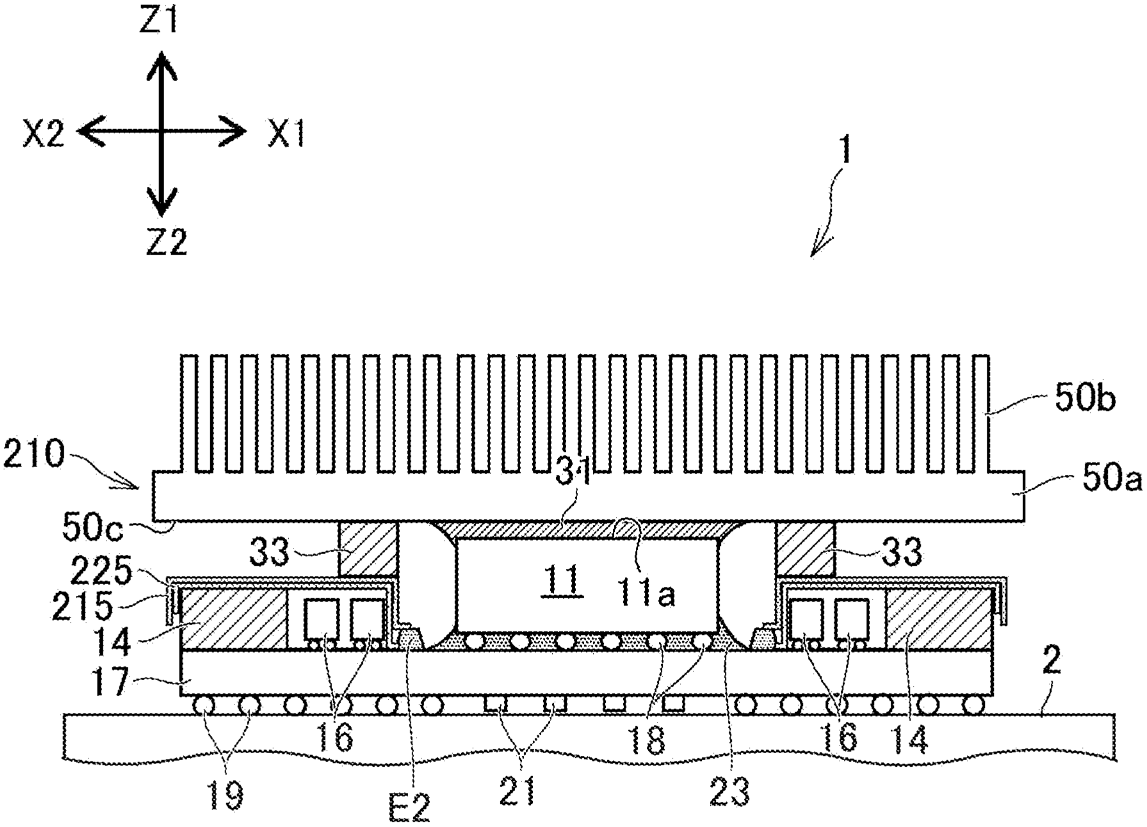
FIG. 9A is a sectional view illustrating still another example of the electronic apparatus proposed in the present disclosure.
Figure 9B:
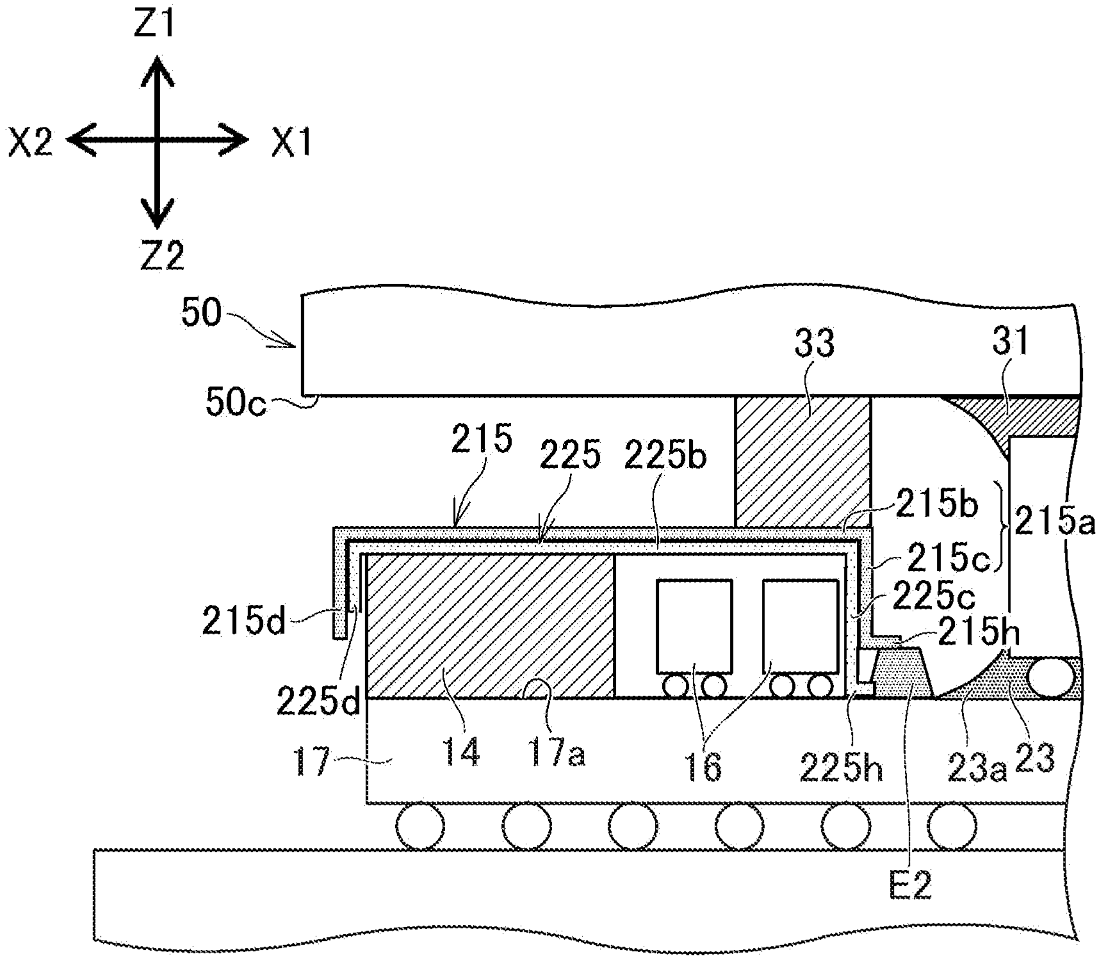
FIG. 9B is an enlarged view of FIG. 9A.

[Further Modification] FIG. 9A is a sectional view illustrating still another modification of the electronic apparatus 1. FIG. 9B is an enlarged view of FIG. 9A. In these figures, the electronic apparatus 1 has a semiconductor device 210 as a modification of the semiconductor device 10. In the figures, the same parts as the parts or members described thus far are identified by the same reference numerals.

The semiconductor device 210 has an insulating sheet 215 (see FIG. 5A) as an insulating portion that covers conductor elements such as the capacitors 16 and the circuit pattern or the like. The insulating sheet 215 is a sheet formed by a resin. Usable as a material for the insulating sheet 215 is, for example, an engineering plastic such as polycarbonate or polyamide as in the insulating sheet 115 described above.

[Liquid Gasket] As illustrated in FIG. 9B, the insulating sheet 215 has a top wall 215*b* located on the upper side of the capacitors 16 and an inner wall 215*c* located on the inside of the capacitors 16. The top wall 215*b* and the inner wall 215*c* constitute a housing portion 215*a* that houses conductor elements such as the capacitors 16. The insulating sheet 215 is attached to the substrate 17 by a liquid gasket E2. Specifically, an attachment target portion 215*h* is formed at a lower end of the inner wall 215*c*, and the attachment target portion 215*h* is attached by the liquid gasket E2.

The liquid gasket has fluidity at room temperature. The liquid gasket dries or becomes uniform after a certain time from application thereof to a bonding surface, and consequently forms an elastic or adhesive thin layer. Materials for the liquid gasket include, for example, a phenol type, a modified ester type, a silicone type, an acrylic type, and the like. The use of such a liquid gasket can ensure a high sealing property between the attachment target portion 215*h* of the insulating sheet 215 and the substrate 17.

The attachment target portion 215*h* formed at a lower edge of the inner wall 215*c* is bent with respect to the inner wall 215*c* and is along the upper surface 17*a* of the substrate 17. The liquid gasket E2 is, for example, disposed between the upper surface 17*a* of the substrate 17 and the attachment target portion 215*h*. This can prevent the liquid gasket E2 from being mounted on the upper side of the semiconductor chip 11 in a process of assembling the semiconductor device 210, and consequently affecting thermal conductivity between the semiconductor chip 11 and the radiator 50.

[Double Insulating Sheet] As illustrated in FIG. 9B, the semiconductor device 210 further includes an insulating sheet 225 as a sheet for covering conductor elements such as the capacitors 16 and the circuit pattern or the like. The insulating sheet 225 is disposed on the lower side of the insulating sheet 215. The two sheets 215 and 225 are superposed on each other. (In the following description, the insulating sheet 215 will be referred to as an upper sheet, and the insulating sheet 225 will be referred to as a lower sheet.) The lower sheet 225 is also attached to the substrate 17. Specifically, the lower sheet 225 also has an inner wall 225*c* on the inside of the capacitors 16, and an attachment target portion 225*h* formed at a lower edge of the inner wall 225*c* is attached to the substrate 17.

A space housing conductor elements such as the capacitors 16 and the circuit pattern or the like is formed between the lower sheet 225 and the substrate 17. Hence, this space is partitioned from a space in which the thermally conductive material 31 is present by the double sheet. That is, the upper sheet 215 forms a space (inside of the housing portion 215*a*) partitioned from the space in which the thermally conductive material 31 is present, and the lower sheet 225 forms, within the housing portion 215*a*, a space partitioned from a space outside the lower sheet 225.

The lower sheet 225 is attached to the substrate 17 by a material different from the liquid gasket. The attachment target portion 225*h* of the lower sheet 225 is bent with respect to the inner wall 225*c* and is along the upper surface 17*a* of the substrate 17. The lower sheet 225 is, for example, attached to the substrate 17 by an adhesive tape (tape having both surfaces coated with an adhesive) disposed between the attachment target portion 225*h* and the substrate 17. A method of attaching the lower sheet 225 to the substrate 17 is not limited to the method using the adhesive tape. For example, the attachment target portion 215*h* of the lower sheet 225 may be attached by an adhesive applied to the substrate 17.

As described above, the thermally conductive material 31 having fluidity is disposed between the lower surface 50*c* of the radiator 50 and the upper surface 11*a* of the semiconductor chip 11. Because the thermally conductive material 31 has fluidity, it is possible that the thermally conductive material 31 comes out from between the lower surface 50*c* of the radiator 50 and the upper surface 11*a* of the semiconductor chip 11 and adheres to the liquid gasket E2. In a case where the radiator 50 and the upper sheet 215 need to be removed in order to repair the electronic apparatus or replace a faulty part, caution is necessary in handling so as to prevent the liquid gasket E2 to which the thermally conductive material 31 adheres from scattering. In the semiconductor device 210, the lower sheet 225 is disposed on the lower side of the upper sheet 215, and further covers the capacitors 16 within the housing portion 215*a*. Thus, even when the liquid gasket E2 scatters at the time of removing the radiator 50 and the upper sheet 215, a range over which the liquid gasket E2 scatters can be limited to a region in which the capacitors 16 are not present.

The lower sheet 225 and the upper sheet 215 may be formed by different materials. For example, the lower sheet 225 may be formed by a material having lower stiffness than the upper sheet 215. In addition, in the example of the semiconductor device 210, the lower sheet 225 is a sheet thinner than the upper sheet 215. An example of a material for the lower sheet 225 is polyethylene terephthalate. The lower sheet 225 may have flexibility. This can reduce a cost increase due to the lower sheet 225.

In the example illustrated in FIG. 9B, the attachment target portion 225*h* of the lower sheet 225 is located below the attachment target portion 215*h* of the upper sheet 215, and partly overlaps the attachment target portion 215*h* of the upper sheet 215 as viewed in plan. A part of the liquid gasket E2 is disposed on the upper side of the attachment target portion 225*h* of the lower sheet 225. The relation between the two attachment target portions 215*h* and 225*h* is not limited to the example illustrated in the figure. The attachment target portion 225*h* of the lower sheet 225 may be separated from the attachment target portion 215*h* of the upper sheet 215 in the horizontal direction.

The semiconductor device 210 has a sealant 33 formed by a material having a cushioning characteristic. In the example illustrated in FIG. 9A and FIG. 9B, the sealant 33 is located above the capacitors 16, and is sandwiched by the upper sheet 215 and the lower surface 50*c* of the radiator 50. The sealant 33 is disposed along an inner edge of the top wall 215*b* of the upper sheet 215. The position of the sealant 33 is not limited to the example illustrated in this figure, but may be located above the stiffener 14, for example.

In the example illustrated in FIG. 9A and FIG. 9B, the sheets 215 and 225 extend outward in the horizontal direction beyond the position of the sealant 33, and respectively have top walls 215*b* and 225*b* that cover the capacitors 16 and the stiffener 14. The sheets 215 and 225 respectively have outer walls 215*d* and 225*d* that descend from outer edges of the top walls 215*b* and 225*b* and cover the stiffener 14. The outer walls 215*d* and 225*d* are neither attached to the stiffener 14 nor attached to the substrate 17. This can reduce work necessary for attachment of the sheets 215 and 225 to the substrate 17.

Unlike this, the outer walls 215*d* and 225*d* may be attached to the stiffener 14 or the substrate 17. For example, the outer wall 215*d* of the upper sheet 215 may be attached to the substrate 17 by a liquid gasket, and the outer wall 225*d* of the lower sheet 225 may be attached to the substrate 17 or the stiffener 14 by means different from the liquid gasket (for example, an adhesive or a double-faced sheet).

The structures of the sheets 215 and 225 are not limited to the example illustrated in these figures. For example, as in the example illustrated in FIG. 5B, the sheets 215 and 225 may have an outer wall located between the stiffener 14 and the capacitors 16. Then, a lower edge (attachment target portion) of the outer wall may be attached to the substrate 17. In this case, a lower edge (attachment target portion) of the outer wall of the upper sheet 215 may be attached to the substrate 17 by a liquid gasket, and a lower edge (attachment target portion) of the outer wall of the lower sheet 225 may be attached to the substrate 17 by means different from the liquid gasket (for example, an adhesive or a double-faced sheet).

[Manufacturing Method] An example of a method of manufacturing the semiconductor device 210 and the electronic apparatus 1 including the semiconductor device 210 will be described. First, the semiconductor chip 11, the capacitors 16, and the stiffener 14 are mounted on the substrate 17. The underfill 23 is filled between the semiconductor chip 11 and the substrate 17. Next, the capacitors 16 are covered by the insulating sheet (lower sheet) 225. Then, the attachment target portion 225*h* is attached to the substrate 17 by an adhesive sheet. Next, the liquid gasket E2 is applied onto the substrate 17, and thereafter the lower sheet 225 is covered by the insulating sheet (upper sheet) 215. Then, the attachment target portion 215*h* of the upper sheet 215 is attached to the substrate 17 by the liquid gasket. The following processes may be the same as processes for manufacturing the semiconductor device 10 and the electronic apparatus 1 including the semiconductor device 10.

[Summary] In the electronic apparatus 1 described above, the thermally conductive material 31 is disposed between the radiator 50 and the semiconductor chip 11. The thermally conductive material 31 has electric conductivity and has fluidity at least at the time of operation of the semiconductor chip 11. The seal member 33 surrounds the thermally conductive material 31, and conductor elements such as a circuit pattern and electric parts or the like are covered by an insulating portion (the insulating portion 15 or the insulating sheets 115, 215, and 225). According to this structure, the seal member 33 and the insulating portion can limit a range over which the thermally conductive material 31 spreads.

In addition, in the electronic apparatus 1, the thermally conductive material 31 is disposed between the radiator 50 and the semiconductor chip 11. The thermally conductive material 31 has electric conductivity and has fluidity at least at the time of operation of the semiconductor chip 11. The conductor elements such as the circuit pattern and the electric parts or the like are covered by an insulating portion (the insulating portion 15 or the insulating sheets 115, 215, and 225). A distance from at least a part of the upper surface of the insulating portion to the lower surface 50*c* of the radiator 50 is larger than a distance from the upper surface 11*a* of the semiconductor chip 11 to the lower surface 50*c* of the radiator 50. According to this structure, the range over which the thermally conductive material spreads can be limited to a region in which the conductor elements such as the electric parts are not present. In addition, adhesion between the radiator and the semiconductor chip can be secured.

The semiconductor devices 110 and 210 have the insulating sheets 115, 215, and 225 that cover the conductor elements such as the circuit pattern and the electric parts or the like. According to the semiconductor devices 110 and 210, the range over which the thermally conductive material 31 spreads can be limited to the region in which the conductor elements are not present.

The semiconductor devices 10, 110, and 210 have an insulating portion (the insulating portion 15 or the insulating sheets 115, 215, and 225) that covers the conductor elements such as the circuit pattern and the electric parts or the like. The height of at least a part of the upper surface of the insulating portion with respect to the substrate 17 is smaller than the height of the upper surface 11*a* of the semiconductor chip 11 with respect to the substrate 17. According to this structure, adhesion between the radiator 50 and the semiconductor chip 11 can be secured while the range over which the thermally conductive material 31 spreads is limited to the region in which the conductor elements such as the electric parts are not present.

The insulating sheets 115 and 215 include the housing portions 115*a* and 215*a* having the top walls 115*b* and 215*b* located on the upper side of the conductor elements and the inner walls 115*c* and 215*c* located on the inside of the top walls 115b and 215b and descending from the top walls 115b and 215b. In addition, the insulating sheets 115 and 215 include the attachment target portions 115h and 215h connected to the inner walls 115c and 215c and located at a position lower than the top walls 115b and 215b. According to the insulating sheets 115 and 215, the range over which the thermally conductive material 31 spreads can be limited to the region in which the conductor elements are not present. In addition, even in a case where a difference in height between the conductor elements (for example, the capacitors 16) and the semiconductor chip 11 is small, the insulating sheets 115 and 215 can be attached to the substrate relatively easily.

An example of a method of manufacturing the semiconductor devices 10, 110, and 210 includes a process of covering the conductor elements such as the circuit pattern and the electric parts or the like by the insulating portion (the insulating portion 15 or the insulating sheets 115, 215, and 225). In the process of covering the conductor elements by the insulating portion, the height of the upper surface of the insulating portion with respect to the substrate 17 is smaller than the height of the upper surface 11a of the semiconductor chip 11 with respect to the substrate 17. According to this method, the range over which the thermally conductive material 31 spreads can be limited to the region in which the conductor elements such as the electric parts are not present. In addition, adhesion between the radiator 50 and the semiconductor chip 11 can be secured.

It is to be noted that the invention according to the present disclosure is not limited to the electronic apparatus, the semiconductor devices, the insulating sheets, and the manufacturing methods described above, but appropriate changes within a scope in which the spirit of the invention is maintained is included in the scope of the present invention.

The invention claimed is:

1. An electronic apparatus comprising:

a semiconductor chip;

a substrate that is disposed on a lower side of the semiconductor chip and has a first region as a region in which the semiconductor chip is mounted and a second region as a region in which a conductor element including at least one of a circuit pattern and an electric part is disposed;

a radiator disposed on an upper side of the semiconductor chip;

a thermally conductive material present between the radiator and the semiconductor chip;

a seal member surrounding the thermally conductive material, the sealing member being made of a different material than the thermally conductive material; and an insulating portion covering the conductor element, wherein the thermally conductive material has electric conductivity, does not have fluidity at the time of non-operation of the semiconductor chip, and has fluidity at least at a time of operation of the semiconductor chip, and the seal member is located between an upper surface of the insulating portion and a lower surface of the radiator.

2. The electronic apparatus according to claim 1, further comprising:

a stiffener attached to the substrate, wherein the insulating portion covers the stiffener, and the seal member is located between an upper surface of the stiffener and a lower surface of the radiator.

3. The electronic apparatus according to claim 1, wherein the seal member is located between the conductor element and a side surface of the semiconductor chip.

4. The electronic apparatus according to claim 1, wherein the seal member is formed by a material that allows a change in thickness of the seal member in an upward downward direction.

5. The electronic apparatus according to claim 1, wherein the insulating portion is a part obtained by curing a resin in a liquid or gel form.

6. The electronic apparatus according to claim 1, wherein a distance from at least a part of an upper surface of the insulating portion to a lower surface of the radiator is larger than a distance from an upper surface of the semiconductor chip to the lower surface of the radiator.

7. The electronic apparatus according to claim 6, wherein a height of the at least a part of the upper surface of the insulating portion with respect to the substrate is smaller than a height of the upper surface of the semiconductor chip with respect to the substrate.

8. The electronic apparatus according to claim 1, wherein an upper surface of the electric part disposed in the second region is covered by the insulating portion.

9. The electronic apparatus according to claim 1, further comprising:

a stiffener attached to the substrate, wherein a height of the at least a part of the upper surface of the insulating portion with respect to the substrate is equal to or smaller than a height of an upper surface of the stiffener with respect to the substrate.

10. An electronic apparatus comprising:

a semiconductor chip;

a substrate that is disposed on a lower side of the semiconductor chip and has a first region as a region in which the semiconductor chip is mounted and a second region as a region in which a conductor element including at least one of a circuit pattern and an electric part is disposed;

a radiator disposed on an upper side of the semiconductor chip;

a thermally conductive material present between the radiator and the semiconductor chip; and an insulating portion covering the conductor element, wherein the thermally conductive material has electric conductivity, does not have fluidity at the time of non-operation of the semiconductor chip, and has fluidity at least at a time of operation of the semiconductor chip, and the insulating portion is a sheet that covers the conductor element.

11. The electronic apparatus according to claim 10, wherein the insulating portion includes a first sheet and a second sheet that cover the conductor element, and the second sheet is disposed on a lower side of the first sheet.

12. The electronic apparatus according to claim 11, wherein a material that attaches the first sheet to the substrate and a material that attaches the second sheet to the substrate are different from each other.

13. The electronic apparatus according to claim 10, wherein the sheet is attached to the substrate by a liquid gasket.

14. The electronic apparatus according to claim 10, further comprising a seal member that surrounds the thermally conductive material.

15. A semiconductor device comprising:

a semiconductor chip;

a substrate that is disposed on a lower side of the semiconductor chip and has a first region as a region in which the semiconductor chip is mounted and a second region as a region in which a conductor element including at least one of a circuit pattern and an electric part is disposed;

an insulating portion covering the conductor element; and a seal member that surrounds the semiconductor chip and is disposed directly in contact with an upper surface of the insulating portion.

16. The semiconductor device according to claim 15, wherein the seal member is formed by a material that allows a change in thickness of the seal member in an upward downward direction.

17. A semiconductor device manufacturing method comprising:

preparing a substrate that has a first region as a region for mounting a semiconductor chip and a second region as a region in which a conductor element including at least one of a circuit pattern and an electric part is disposed;

covering an upper side of the conductor element by an insulating portion; and disposing a seal member surrounding the first region and directly in contact with an upper surface of the insulating portion.

* * * * *